(12) United States Patent
Kim

(10) Patent No.: US 11,257,538 B2
(45) Date of Patent: Feb. 22, 2022

(54) SYSTEMS AND METHODS FOR IMPROVED RELIABILITY OF COMPONENTS IN DYNAMIC RANDOM ACCESS MEMORY (DRAM)

(71) Applicant: Micron Technology, Inc., Boise, ID (US)

(72) Inventor: Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/150,996

(22) Filed: Oct. 3, 2018

(65) Prior Publication Data

US 2020/0111521 A1 Apr. 9, 2020

(51) Int. Cl.
| | | |
|---|---|---|
| G11C 8/08 | (2006.01) | |
| G11C 11/4076 | (2006.01) | |
| G11C 11/408 | (2006.01) | |
| G11C 11/4096 | (2006.01) | |
| G11C 7/22 | (2006.01) | |
| G11C 11/4074 | (2006.01) | |

(52) U.S. Cl.
CPC ............ *G11C 11/4076* (2013.01); *G11C 7/22* (2013.01); *G11C 8/08* (2013.01); *G11C 11/4074* (2013.01); *G11C 11/4085* (2013.01); *G11C 11/4096* (2013.01)

(58) Field of Classification Search
CPC ... G11C 11/4085; G11C 11/4076; G11C 8/08; G11C 8/10; G11C 11/4096; G11C 7/22; G11C 11/4074; G11C 7/1063; G11C 11/4093; G11C 7/04
See application file for complete search history.

(56) References Cited

U.S. PATENT DOCUMENTS

| | | | | |
|---|---|---|---|---|
| 5,457,420 A | * | 10/1995 | Asada | H03K 3/356017 326/81 |
| 2002/0149398 A1 | * | 10/2002 | Ingino, Jr. | H03K 3/0315 327/52 |
| 2017/0301396 A1 | * | 10/2017 | Dhori | G11C 11/419 |
| 2018/0203058 A1 | * | 7/2018 | Kim | G01R 31/2642 |
| 2018/0308530 A1 | * | 10/2018 | Kim | G11C 8/10 |
| 2019/0172503 A1 | * | 6/2019 | Takeda | G11C 5/14 |
| 2020/0090713 A1 | * | 3/2020 | Joo | G11C 7/222 |

* cited by examiner

*Primary Examiner* — Jay W. Radke
(74) *Attorney, Agent, or Firm* — Fletcher Yoder, P.C.

(57) ABSTRACT

A memory device is provided. The memory device comprises at least one word line driver comprising a first and a second switching device, wherein the word line driver is configured to activate a word line electrically coupled to one or more memory cells included in a memory bank. The memory device additionally comprises a memory bank controller operatively coupled to the at least one word line driver. The memory bank controller is configured to provide a word line power supply (PH) signal, a word line ON control (GR) signal, and a word line OFF control (PHF) signal to the at least one word line driver, and to adjust a timing of the PH, the GR, and the PHF signals to reduce or to eliminate a non-conducting stress (NCS) condition, a time dependent temperature instability (TDDB) condition, or a combination thereof, of the first switching device, of the second switching device, or of a combination thereof.

14 Claims, 5 Drawing Sheets

SYSTEMS AND METHODS FOR IMPROVED RELIABILITY OF COMPONENTS IN DYNAMIC RANDOM ACCESS MEMORY (DRAM)

BACKGROUND

Field of the Present Disclosure

The present disclosure relates to dynamic random access memory (DRAM), and more specifically, to systems and methods for improving reliability in certain DRAM components.

Description of Related Art

Certain read/write memory devices, such as dynamic random access memory (DRAM), include arrays having memory cells that store information. For example, certain DRAM devices, such as synchronous dynamic RAM (SDRAM) devices may have multiple memory banks having many addressable memory elements or cells included in memory arrays. Certain electronic components may be used to define cell circuitry, array circuitry, and so on. In use, the SDRAM devices may receive data input signals at high speeds, such as speeds of 1 gigabits per second (Gbps) or more, and store data in the memory cells based on the data input signals. The memory cells may then be accessible to external systems and may be used to retrieve the data stored therein, for example, by providing for an address of one or more of the memory cells. It would be beneficial to improve the reliability of certain components included in DRAM systems.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include random access memory (RAM) memory devices coupled to processing circuitry, and the memory devices may provide storage for data processing. Examples of RAM devices include dynamic RAM (DRAM) devices and synchronous DRAM (SDRAM) devices, which may store individual bits electronically. The stored bits may be organized into addressable memory elements (e.g., words), which may be stored in memory banks. To receive and to transmit the bits, the RAM devices may include certain data communications circuitry as well as communication lines, e.g., (digit lines, word lines), useful in saving and retrieving the bits from the memory bank. In certain DRAM and SDRAM devices, word lines connecting a row of cells may include certain components, such as N-type metal-oxide-semiconductor (NMOS) devices (e.g., transistors).

During operations of a word line driver, the word line driver circuit may be operating at certain voltages and at certain times. For example, during row active time (tRAS), NMOS devices included in the word line driver may experience voltages at certain low and high ranges, such as between −1 V and +5 V, at certain times, which over the course of operations may result in aging stress (e.g., non-conducting stress NCS and Time-Dependent Dielectric Breakdown TDDB which may also be referred to as time dependent temperature instability). To help alleviate this issue, the embodiments further described herein may include a reliability improvement system (RIS) which may monitor and control certain circuitry e.g. word line driver circuits) to identify states and/or operating conditions and to modify voltages (e.g. control signals) used by the circuitry.

For example, control signals or timing signals delivered to the word line driver circuits may be modified so that voltages, such as high voltages, may be reduced while still resulting in standard operations. That is, the RIS may modify the control or timing signals either via voltage changes, timing changes, or a combination thereof, so that reads/writes of memory cells may use NMOS devices having improved reliable operation, as further described below.

Figure 1:
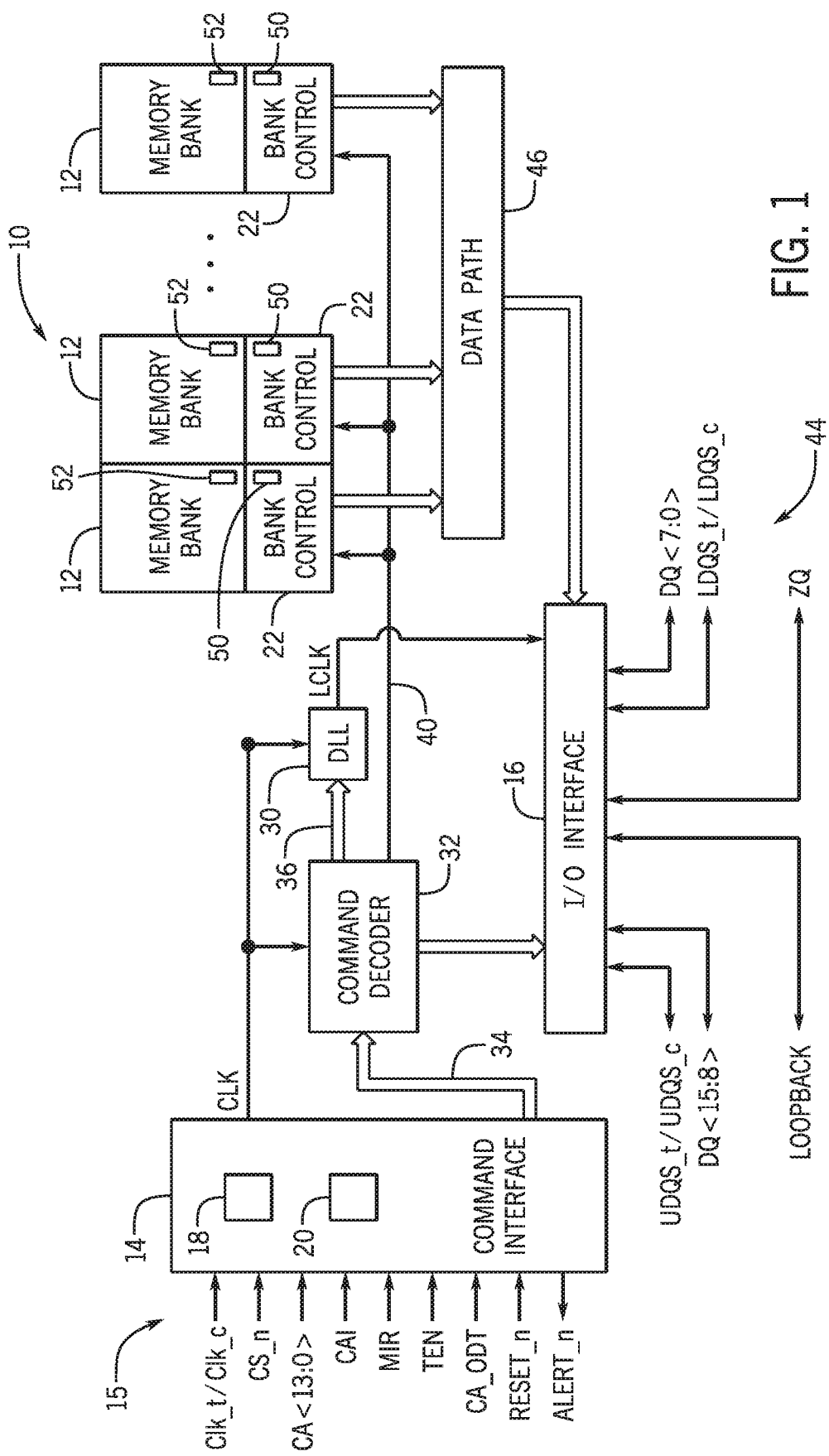
FIG. 1 is a block diagram illustrating an organization of a memory device that may include a reliability improvement system (RIS) disposed in a memory controller, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM as further described herein allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to receive or provide a number of signals (e.g., signals 15) from an external device (not shown), such as a processor or controller. The processor or controller may receive or provide various signals 15 from/to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command (WrCmd), etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 (e.g., memory bank controller) which provides the necessary decoding (e.g., row decoder and column decoder), as well as other features, such as timing control, voltage control, and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0). The command/address signals are clocked to the command interface 14 using the clock signals (Clk_t/and Clk_c). The command interface may include & the command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data for read and write commands may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

The data (e.g., IO signals) for read and writes may be addressed to certain memory (e.g., memory cells) in the memory banks 12. The techniques described herein, including a reliability improvement system (RIS) 50, may provide for voltage and/or timing changes, for example, during row active time (tRAS). As described herein, tRAS may refer to a time during which a certain row of memory cells is kept "active" so as to read, for example, the data addressed to one or more memory cells in the row. By changing the voltage and/or timing of certain components, such as NMOS components that operate (e.g., read and/or write) on the memory cells, the components may experience a longer lifecycle of operations. The RIS 50 is depicted as being included in the bank control 22. During operations, the RIS 50 may determine that certain timings and/or voltages should be manipulated to enhance component reliability. Accordingly, the RIS 50 may change timings and/or voltages for certain memory bank circuitry, such as word line driver circuitry 52, based on certain operations (e.g., during tRAS) to reduce non-conducting stress NCS and/or Time-Dependent Dielectric Breakdown TDDB issues in the NMOS components. By manipulating the timings and/or voltages of the word line driver circuitry 52, the RIS may thus extend the operating life of the NMOS components.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description. For example, the reliability improvement system (RIS) 50 or certain circuitry of the MS system 50 may be disposed as part of one memory bank control 22 or all memory bank controls 22, or combinations thereof.

Figure 2:
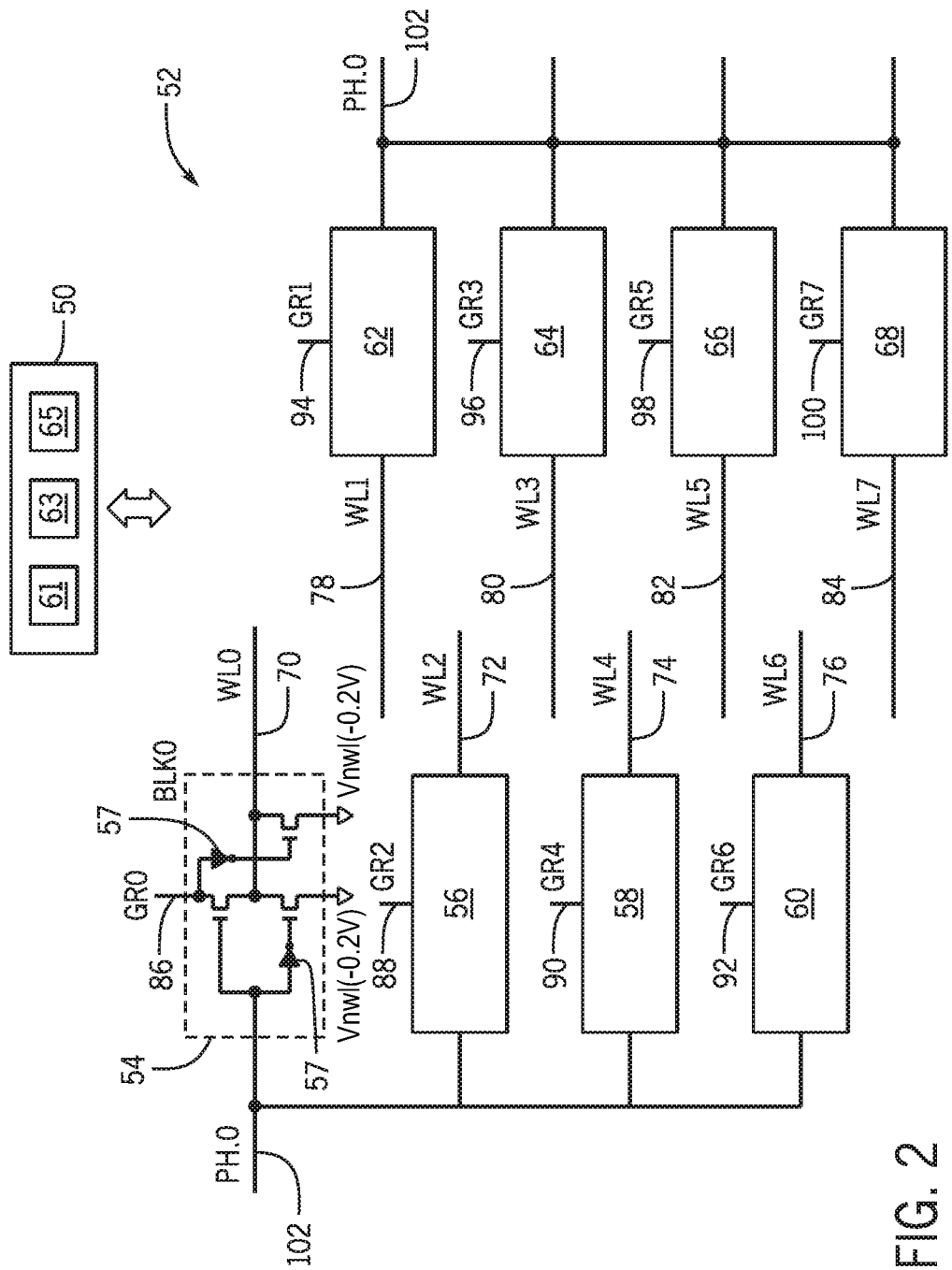
FIG. 2 is a block diagram of a simplified array of individual word line drivers each of which may be operatively coupled to one or more word lines and to the RIS of FIG. 1, in accordance with an embodiment.
Figure 3B:
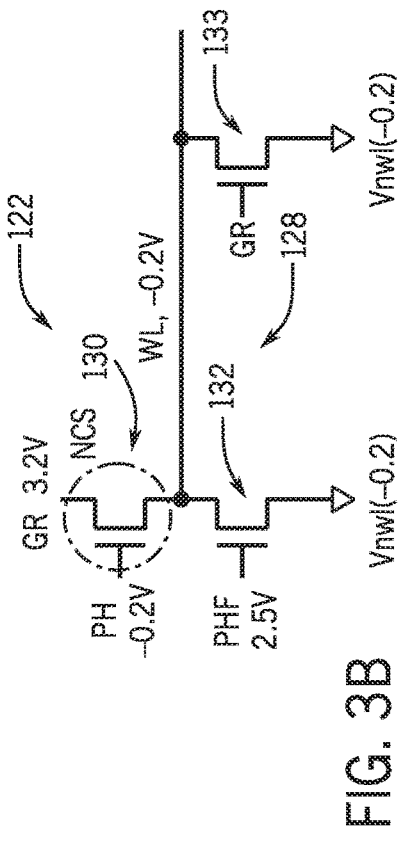
FIG. 3B is a diagram depicting a second condition that may be experienced by circuitry included in each of the word line drivers of FIG. 2, in accordance with an embodiment.
Figure 3D:
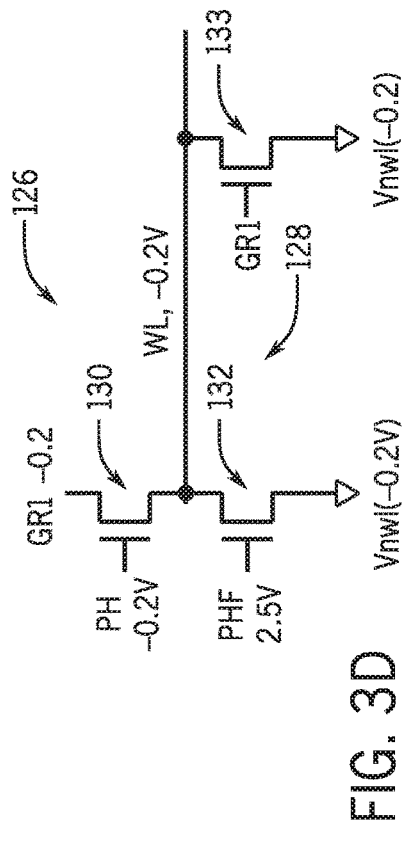
FIG. 3D is a diagram depicting a fourth condition that may be experienced by circuitry included in each of the word line drivers of FIG. 2, in accordance with an embodiment.
Figure 3A:
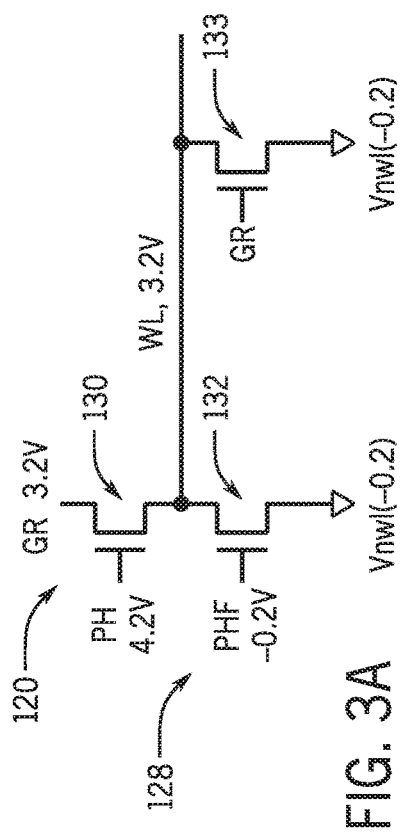
FIG. 3A is a diagram depicting a first condition that may be experienced by circuitry included in each of the word line drivers of FIG. 2, in accordance with an embodiment.
Figure 3C:
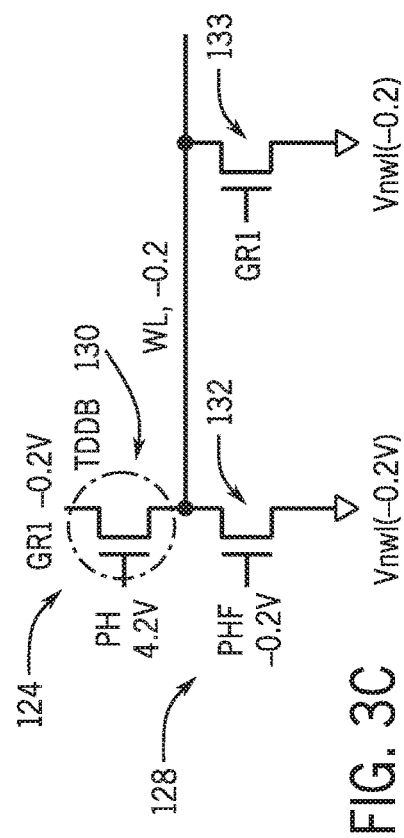
FIG. 3C is a diagram depicting a third condition that may be experienced by circuitry included in each of the word line drivers of FIG. 2, in accordance with an embodiment.

It would be beneficial to illustrate an embodiment of certain word line drivers that may benefit from the techniques described herein. Accordingly, FIG. 2 depicts an embodiment of a simplified array 52 of individual word line drivers 54, 56, 58, 60, 62, 64, 66, 68 (e.g., subword line drivers) each of which may comprise three NMOS transistors and two inverters 57, and may be operatively coupled to one or more word lines 70, 72, 74, 76, 78, 80, 82, and 84, respectively of the memory bank 12. That is, the word lines 70, 72, 74, 76, 78, 80, 82, and 84 may be representative of rows in an array of memory cells of the memory bank 12, and as such each of the word lines 70, 72, 74, 76, 78, 80, 82, and 84 may be coupled to multiple memory cells, e.g., capacitors (not shown) used to store data in the memory device 10.

It is to be understood that the depicted simplified embodiment is an example only for illustration and other word line arrays 52 and word line drivers 54, 56, 58, 60, 62, 64, 66, 68 may include more or less electronic components and/or connections. In the depicted embodiment, each word line driver 54, 56, 58, 60, 62, 64, 66, 68 is communicatively coupled to a word line "on" control line (GR0) 86, 88, 90, 92, 94, 96, 98, 100, respectively, and a word line control signal (PH) 102.

In certain embodiments, control signals transmitted to lines GR0 86, 88, 90, 92, 94, 96, 98, 100 and PH 102 may be transmitted by the memory bank controller 22, e.g., via the RIS 50, using decoding logic. For example, choosing which one of the GRs to use may be derived by decoding bits 0-2 of a memory address and choosing PH 102 may be derived by decoding bits 3-n (uppermost address bits). In one example, when none of the word lines 70, 72, 74, 76, 78, 80, 82, and 84 (e.g., labeled 0-7) is selected, PH0 goes Low and all word lines 70, 72, 74, 76, 78, 80, 82, and 84 (e.g., labeled 0-7) may turn "off". However, when word line 70 (e.g., labeled WL0) is selected, both PH0 102 and GR0 86 (labeled GR0) go Logic High while the other GRs 88, 90, 92, 94, 96, 98, and 100 go Logic Low. Likewise, when word line 78 (e.g., labeled WL1) is selected PH0 and GR1 go Logic High while the other GR0s 86, 88, 90, 92, 96, 98, and 100 go Logic Low. Accordingly, each of the word lines labeled WL0-WL7 may be selected via decoding logic, for example in the RIS 50, to turn on or off. However, certain voltages may impact the life of electronic components in each of the word line drivers 54, 56, 58, 60, 62, 64, 66, 68.

Accordingly, the RIS 50 may include certain systems to change voltages and/or adjust timings of the word line control signal 54, 56, 58, 60, 62, 64, 66, 68. For example, a level shifter system 61 may be used to transform signals from one logic level or voltage domain to a second logic level or voltage domain. The level shifter system 61 may use any level shifting circuitry such as fixed function level circuits, configurable mixed-signal circuits, and so on, suitable for example, for transforming the first logic level (e.g., 4.2V) into the second voltage level (e.g., 3.2V). A delay chain system 63 may also be used, for example, to introduce timing delays. For example, the delay chain system 63 may include delay-locked loop circuits, phase-locked loop circuits, delay line circuits, flip-flops, or a combination thereof. Power switch systems 65 may also be used, for example, to transmit voltages from a first power source at the first logic level, from a second power source at the second logic level, and so on. The systems 61, 63, and 65 may be used alone or in combination with each other. The RIS 50 may then adjust voltages and/or timings as further described with respect to certain word line control signal shown in FIG. 3.

FIG. 3 is a diagram depicting embodiments of four word line driver conditions 120, 122, 124, 126. More specifically, the depicted conditions 120, 122, 124, 126 may be experienced by circuitry 128 which may be included in each of the word line drivers 54, 56, 58, 60, 62, 64, 66, and 68. In the depicted embodiments, the conditions 120, 122, 124 and 126 may occur during tRAS. During condition 120, a switching device 130 (e.g., NMOS device) included in the circuitry may receive a word line control signal (PH) voltage of 4.2V, for example, at its gate while a switching device 132 (e.g., NMOS device) may receive a logically inverted word line control signal (PHF) having voltage of –0.2V, for example at its gate. Voltage of a word line "ON" signal (GR) (e.g., sent to drain of device 130) may be set to "ON" via power supply Vccp, and have a voltage of 3.2V, for example. Accordingly, a word line may go "active", providing certain voltage (e.g., 3.2 V) to one or more memory cells of the memory bank.

During condition 122, the word line "ON" control signal (GR) may still be "ON" (e.g., 3.2V) but the word line control signal (PH) voltage may be brought down to negative word line bias (Vnwl) (e.g., –0.2V). The PHF signal may now be at a driving voltage (Vdrv) (e.g., 2.5V). Accordingly, the word line (WL) may be at Vnwl (e.g., –0.2V). In condition 122, the NMOS device 130 may be experiencing a non-conducting stress (NCS). During NCS, hot-carriers (HC) may be generated even when the NMOS device 130 is turned off, leading to degradation effects comparable to those induced during on-state operation. Especially in high speed memory read or writes, lateral electric fields may overcome the NMOS device 130 specification when its gate voltage lies below threshold. The induced detrimental effect (e.g., NCS effect) may reduce performance of the NMOS device 130 over time, and thus performance of the word line drivers 54, 56, 58, 60, 62, 64, 66, 68.

In condition 124, the word line control (GR1) may be set to Vnwl (e.g., –0.2V), the PH voltage may be ON, (e.g., 4.2V), and the PHF signal may now be at Vnwl (e.g., –0.2V). The word line (WL) is thus also at Vnwl (e.g., –0.2V). In condition 124, the NMOS device 130 may experience time dependent temperature instability (TDDB). TDDB may manifest as an increase in the threshold voltage and consequent decrease in drain current and transconductance of the NMOS device 130, thus again reducing performance of the NMOS device 130 over time, and thus performance of the word line drivers 54, 56, 58, 60, 62, 64, 66, 68. TDDB may exhibit a logarithmic dependence on time.

In condition 126 the word line control (GR1) and the PH voltage may both be at Vnwl (e.g., –0.2V) while the PHF signal may now be at Vdrv (e.g., 2.5V). Accordingly, the word line (WL) may be at Vnwl (e.g., –0.2V). It is to be noted that while Vnwl, Vdrv, and power supply voltages are depicted as –0.2V, 2.5V, and 4.2V respectively, these voltage values are for example only and other values may be used. It may be desirable to reduce or eliminate NCS and/or TDDB that may be occurring during conditions 120 and 124. Accordingly, the techniques described herein may control certain voltage timings, as described in more detail below, to improve operations of the word line drivers 54, 56, 58, 60, 62, 64, 66, 68 by reducing or eliminating NCS and TDDB.

It is to be understood that while the depicted embodiments show Vccph (e.g., which may be referred to as full word line power supply voltage or also as full word line control signal voltage) at 4.2V, Vccp (e.g., which may be referred to as full word line ON voltage) at 3.2V, Vnwl at –0.2V, and Vdrv at 2.5V, other embodiments may use different voltages to activate and deactivate the word lines. It is also to be understood that while the techniques described herein are applicable to NMOS devices, such as transistors, other electronic devices, such as complementary metal-oxide-semiconductor (CMOS) devices, metal-oxide-semiconductor field-effect transistor (MOSFET) devices, and the like, may benefit from the described techniques.

Figure 4:
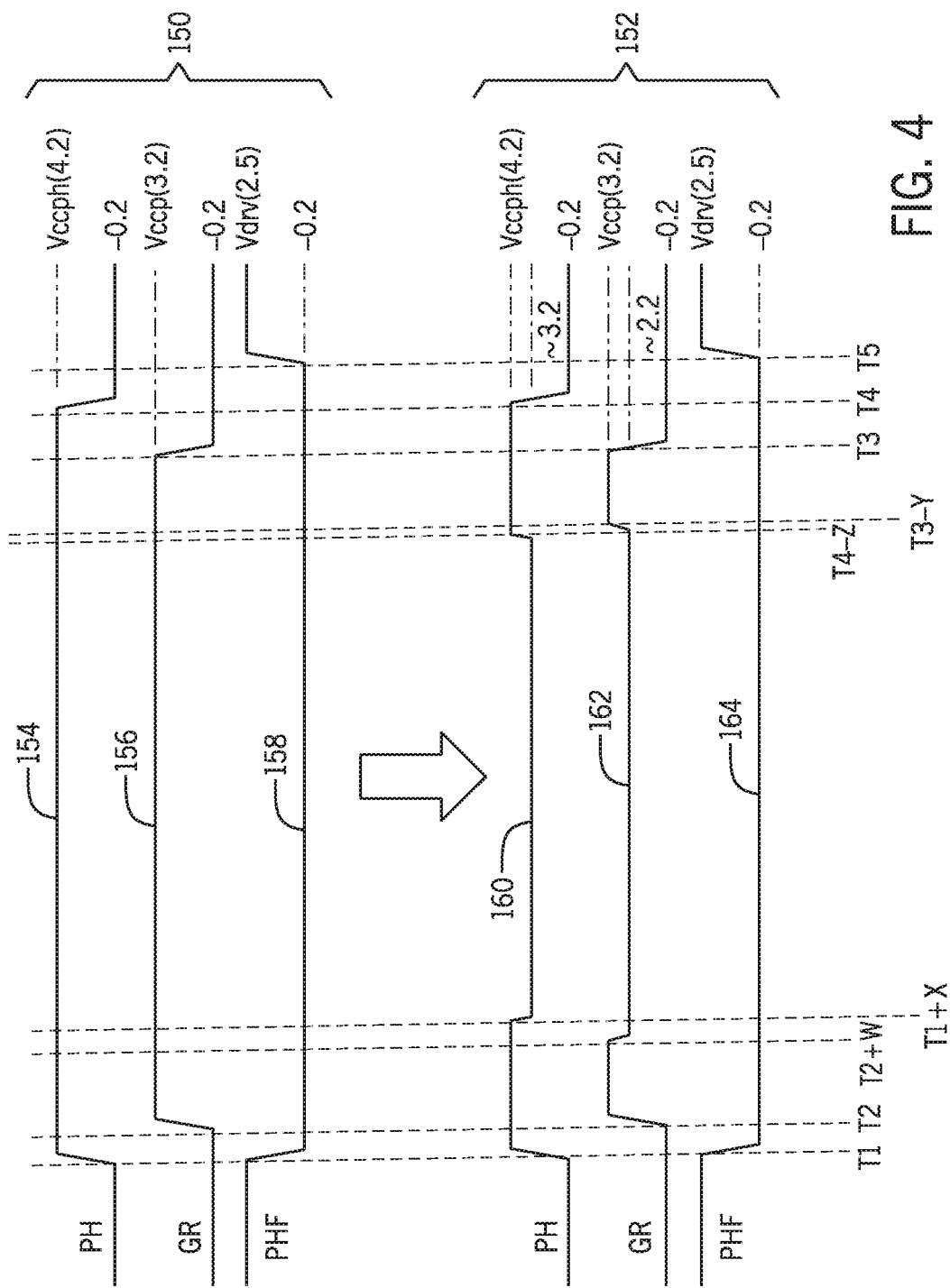
FIG. 4 is a first and a second timing diagram for signals that may be transmitted by the memory controller of FIG. 1, in accordance with an embodiment.

FIG. 4 illustrates embodiments of two timing diagrams 150 and 152, each diagram having a time in the X-axis and a voltage in the Y-axis. Timing diagram 150 may be used by the memory bank control 22 to operate certain word line drivers (e.g., word line drivers 54, 56, 58, 60, 62, 64, 66, 68), while timing diagram 152 may be a modification of the timing diagram 150 with timings to reduce or eliminate NCS and/or TDDB. The timing diagram 152, for example, may be implemented via the RIS 50 of the memory bank control 22 based on the timing diagram 150.

In the depicted embodiment, timing diagram 150 includes signals PH 154, GR 156, and PHF 158 described previously with respect to the circuitry 128. During operations, such as during tRAS, the memory bank controller 22 may cause PH 154 to transition to power supply voltage (e.g., to 4.2V) while additionally causing PHF to transition to Vnwl (e.g., –0.2V) at time T1. At time T2, the memory bank controller 22 may cause GR 156 to transition to power supply Vccp voltage (e.g., 3.2V). Accordingly, the word line (WL) of the word line driver may go active, e.g., transition to Vccp (e.g., 3.2V), after time T2. Once read/write operations are finishing, the memory bank controller 22 may cause GR 156 to transition to Vnwl (e.g., –0.2V) at time T3, and additionally cause PH 154 to also transition to Vnwl (e.g., 0.2V) at time T4. At time T5, the memory bank controller 22 may then cause PHF 158 to transition to Vdrv (e.g., 2.5V), thus completing the read/write operation.

The RIS 50 included in the memory bank control 22 may modify the timing diagram 150 into the timing diagram 152 in order to reduce or to eliminate NCS and/or TDDB. More specifically, times T1 and T2 in the timing diagram 152 would behave as before (e.g., as in the timing diagram 150), but at time T2+W, the RIS 50 may cause GR 162 to transition to a voltage amount less than the full Vccp power supply voltage, such as Vccp–1V (e.g., 2.2V). Additionally, the RIS 50 at T1+X may case PH 160 to transition to a voltage amount less than the full Vccph power supply voltage, such as Vccph–1V (e.g., 3.2V). At time T3–Y, the RIS 50 may cause GR 162 to transition from Vccp-1V back to Vccp voltage (e.g., 3.2V) and at time T4-Z, the RIS 50 may cause PH 160 to transition from the Vccph–1V (e.g., 3.2V) back to Vccph voltage (e.g., 4.2V). Times T3, T4, and T5 may then also behave as before (e.g., as in the timing diagram 150). Similarly, PHF 164 of the timing diagram 152 may remain unchanged when compared to PHF 158 of the timing diagram 150. By slightly dropping voltages (e.g., at times T2+W, T1+X), and then restoring the dropped voltages (e.g., at times T3−Y, T4−Z), the techniques described herein may provide for voltages at the NMOS device 130 that may reduce or eliminate NCS and/or TDDB. It is to be noted that the values for W, X, Y, and Z times may be between 0.01 to 100 nanoseconds. In some embodiments, the W, X, Y, and Z times may be between 0.025 to 10 cycles. As mentioned earlier, the systems, 61, 63, and/or 65 of the RIS 50 may be used to adjust voltages and/or timings.

Figure 5:
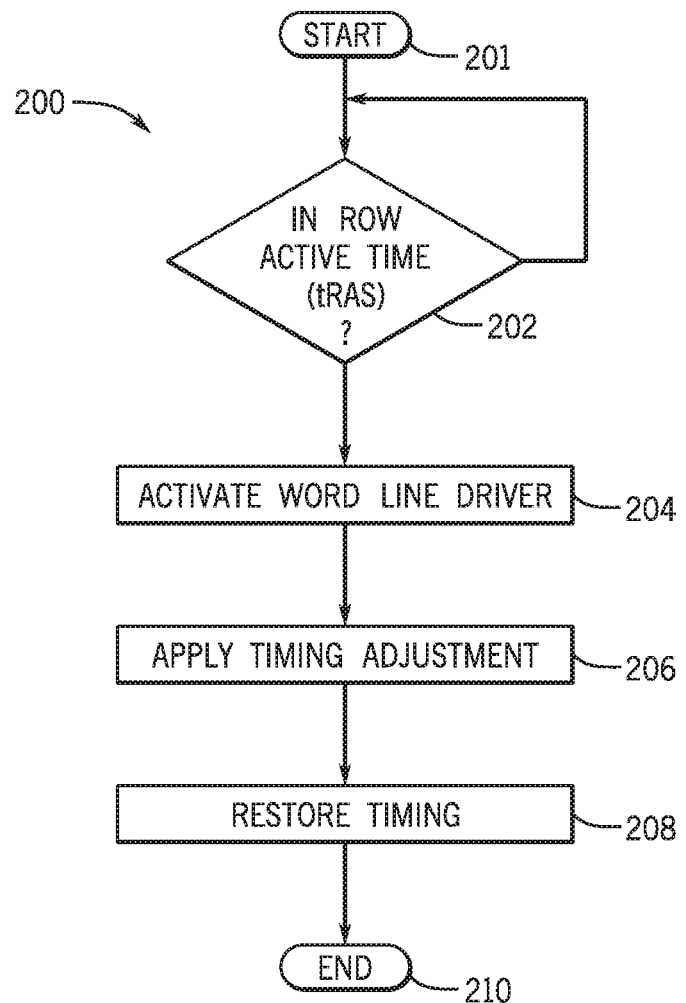
FIG. 5 is flowchart of a process suitable for adjusting timing of signals of FIG. 4 to eliminate or reduce non-conducting stress (NCS) and/or time dependent temperature instability (TDDB) issues in the circuitry of FIG. 3, in accordance with an embodiment.

FIG. 5 is flowchart illustrating an embodiment of a process 200 suitable for adjusting timings, e.g., timings during tRAS, to reduce or to eliminate NCS and/or TDDB in circuitry such as the word line drivers 54, 56, 58, 60, 62, 64, 66, 68. The process 200 may be implemented in hardware and/or as software instructions executable via the RIS 50. In the depicted embodiment, the process 200 may start (block 201) and may first determine (decision 202) if the memory device 10 is in row active time (tRAS). In tRAS, there may be a minimum number of clock cycles that a given row of memory cells has to be active so that there is time to access the information that is in the row. If not in tRAS, then no action is taken by the MS 50. If in tRAS (decision 202), then the process 200 may activate (block 204) via the MS 50 one or more word line drivers (e.g., word line drivers 54, 56, 58, 60, 62, 64, 66, 68) for the row(s) in tRAS. Activation of the rows may include transitioning (e.g., at T1) PH 160 for the one or more word line drivers to Vccph power supply voltage (e.g., 4.2V) from Vnwl (e.g., −0.2V) and transitioning PHF 164 to Vnwl voltage (e.g., −0.2V) from Vdrv voltage (e.g., 2.5V). GR 162 may then be transitioned (e.g., at T2) to Vccp power supply voltage (e.g., 3.2V) from Vnwl voltage (e.g., −0.2V).

The process 200 may then apply (block 206), via the RIS 50, timing adjustments to reduce or eliminate NCS and/or TDDB. For example, the process 200 may transition PH 160 (e.g., at T1+X) to a voltage lower (e.g., 3.2V) than the current voltage (e.g., 4.2V). For example, a value between 0.1V to 2V may be subtracted from Vccph power supply voltage to lower PH 160. GR's current voltage (e.g., 3.2V) may also be lowered (e.g., at T2+2) to a lower voltage (e.g., 2.2V). For example, a value between 0.1V to 2V may be subtracted from Vccp power supply voltage to lower GR 162.

The process 200 may then, at the end of the row cycles, restore (block 208) the adjustments, and then end (block 210). For example, PH 160 may be transitioned (e.g., at time T4−Z) back to Vccph power supply voltage (e.g., 4.2V) and GR 162 may be transitioned (e.g., at time T3−Y) back to Vccp power supply voltage (e.g., 3.2V). Restoring PH 160 and GR 162 may provide for full data read/writes to memory cells in the row. The process 200 may then proceed to T3, T4, and T5, as described above with respect to FIG. 4. Again, it is to be noted that the values for W, X, Y, and Z times may be between 0.1 to 100 nanoseconds. In some embodiments, the W, X, Y, and Z times may be between 0.25 to 10 cycles. It is also to be noted that the reduction in voltages may be accomplished by using separate power supplies, by reduction via electronic components (e.g., switching a resistor on and off into existing power supplies), or by a combination thereof.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device, comprising:
at least one word line driver comprising a first and a second switching device, wherein the word line driver is configured to activate a word line electrically coupled to one or more memory cells included in a memory bank; and
a memory bank controller operatively coupled to the at least one word line driver, wherein the memory bank controller is configured to:
provide a word line control signal, a word line ON control signal, and a word line OFF control signal to the at least one word line driver; and
adjust a timing of the word line control signal, the word line ON control signal, and the word line OFF control signal, wherein the memory bank controller is configured to adjust the timing only during a row active time (tRAS) by transitioning the word line control signal to a full word line power supply voltage at a time T1, and then to reduce the word line control signal from the full word line power supply voltage to a lower voltage at time T1+X, wherein X comprises a clock cycle value, a nanosecond value, or a combination thereof.

2. The device of claim 1, wherein X comprises between 0.025 and 5 clock cycles, 0.01 to 10 nanoseconds, or a combination thereof, to reduce or to eliminate the TDDB condition.

3. The device of claim 1, wherein the memory bank controller is configured to adjust the timing by transitioning the word line control signal to the full word line power supply voltage at a time T1, to reduce the word line control signal from the full word line power supply voltage to the lower voltage at time T1+X, and then to transition the word line control signal to the full word line power supply voltage at time T3−Y, wherein Y comprises a second clock cycle value, a second nanosecond value, or a combination thereof.

4. The device of claim 1, wherein the memory bank controller is configured to adjust the timing by transitioning the word line ON control signal to a full word line ON voltage at a time T2, and then to reduce the word line ON control signal from the full word line ON voltage to a lower voltage at time T2+W, wherein W comprises a clock cycle value, a nanosecond value, or a combination, thereof.

5. The device of claim 4, wherein the memory bank controller is configured to adjust the timing by transitioning the word line ON control signal to the full word line ON voltage at the time T2, then to reduce the word line ON control signal from the full word line ON voltage to the lower voltage at time T2+W, and then to transition the word line ON control signal to the full word line ON voltage at time T4−Z, wherein Z comprises a clock cycle value, a nanosecond value, or a combination, thereof.

6. The device of claim 1, wherein the first switching device is electrically coupled in series with the second switching device.

7. The device of claim 6, wherein the first switching device, the second switching device or a combination thereof, comprises an N-type metal-oxide-semiconductor (NMOS) device, a complementary metal-oxide-semiconductor (CMOS) device, a metal-oxide-semiconductor field-effect transistor (MOSFET) device, or a combination thereof.

8. The device of claim 6, wherein the word line control signal is delivered to a first gate of the first switching device, the word line ON control signal is delivered to a drain of the first switching device, and the word line OFF control signal is delivered to a second gate of the second switching device.

9. A method for operating a memory device, comprising:
providing a word line control signal, a word line ON control signal, and a word line OFF control signal to at least one word line driver included in a memory bank of the memory device, wherein the at least one word line driver comprises a first and a second switching device, and wherein the at least one word line driver is configured to activate a word line electrically coupled to one or more memory cells of the memory bank; and
adjusting a timing of the word line control signal, the word line ON control signal, and the word line OFF control signal, wherein adjusting the timing comprises adjusting the timing only during a row active time (tRAS) by transitioning the word line control signal to a full word line power supply voltage at a time T1, and then reducing the word line control signal from the full word line power supply voltage to a lower voltage at time T1+X, wherein X comprises a clock cycle value, a nanosecond value, or a combination, thereof.

10. The method of claim 9, wherein adjusting the timing comprises transitioning the word line control signal to the full word line power supply voltage at a time T1, to reduce the word line control signal from the full word line power supply voltage to the lower voltage at time T1+X, and then to transition the word line control signal to the full word line power supply voltage at time T3−Y, wherein Y comprises a second clock cycle value, a second nanosecond value, or a combination, thereof.

11. The method of claim 9, wherein adjusting the timing comprises transitioning the word line ON control signal to a full word line ON voltage at a time T2, and then to reduce the word line ON control signal from the full word line ON voltage to a lower voltage at time T2+W, wherein W comprises a clock cycle value, a nanosecond value, or a combination, thereof.

12. A system, comprising:
a memory bank controller operatively coupled to at least one word line driver, wherein the memory bank controller is configured to:
control reads and writes of data into a memory bank;
provide a word line control signal, a word line ON control signal, and a word line OFF control signal to the at least one word line driver; and
adjust a timing of the word line control signal, the word line ON control signal, and the word line OFF control signal, wherein the memory bank controller is configured to adjust the timing only during a row active time (tRAS) by transitioning the word line control signal to a full word line power supply voltage at a time T1, and then to reduce the word line control signal from the full word line power supply voltage to a lower voltage at time T1+X, wherein X comprises a clock cycle value, a nanosecond value, or a combination, thereof.

13. The system of claim 12, wherein the memory bank controller is configured to adjust the timing by transitioning the word line control signal to the full word line power supply voltage at a time T1, to reduce the word line control signal from the full word line power supply voltage to the lower voltage at time T1+X, and then to transition the word line control signal to the full word line power supply voltage at time T3-Y wherein Y comprises a second clock cycle value, a second nanosecond value, or a combination, thereof.

14. The system of claim 12, wherein the memory bank controller is configured to adjust the timing by transitioning the word line ON control signal to a full word line ON voltage at a time T2, and then to reduce the word line ON control signal from the full word line ON voltage to a lower voltage at time T2+W, wherein W comprises a clock cycle value, a nanosecond value, or a combination, thereof.

* * * * *